United States Patent
Itoh et al.

(10) Patent No.: US 9,412,592 B2
(45) Date of Patent: Aug. 9, 2016

(54) IMPRINT MASK, METHOD FOR MANUFACTURING THE SAME, AND METHOD FOR MANUFACTURING SEMICONDUCTOR DEVICE

(71) Applicant: Kabushiki Kaisha Toshiba, Tokyo (JP)

(72) Inventors: Masamitsu Itoh, Kanagawa-ken (JP); Shingo Kanamitsu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 14/279,354

(22) Filed: May 16, 2014

(65) Prior Publication Data

US 2014/0256158 A1    Sep. 11, 2014

Related U.S. Application Data

(62) Division of application No. 13/115,758, filed on May 25, 2011, now Pat. No. 8,758,005.

(30) Foreign Application Priority Data

May 27, 2010    (JP) ................. 2010-121446

(51) Int. Cl.
| | |
|---|---|
| *B29C 59/02* | (2006.01) |
| *H01L 21/027* | (2006.01) |
| *B82Y 10/00* | (2011.01) |
| *B82Y 40/00* | (2011.01) |
| *G03F 7/00* | (2006.01) |

(52) U.S. Cl.
CPC .......... *H01L 21/0274* (2013.01); *B29C 59/022* (2013.01); *B82Y 10/00* (2013.01); *B82Y 40/00* (2013.01); *G03F 7/0002* (2013.01); *Y10T 428/24479* (2015.01)

(58) Field of Classification Search
CPC ..................................................... G03F 7/0002
USPC ............... 425/174, 174.4, 385; 264/446, 447, 264/494, 496
See application file for complete search history.

(56) References Cited

U.S. PATENT DOCUMENTS

| | | |
|---|---|---|
| 6,335,129 B1 | 1/2002 | Asano et al. |
| 6,482,742 B1 | 11/2002 | Chou |
| 6,720,116 B1 | 4/2004 | Tzu et al. |
| 6,936,181 B2 | 8/2005 | Bulthaup et al. |
| 7,322,287 B2 | 1/2008 | Tan et al. |

(Continued)

FOREIGN PATENT DOCUMENTS

| | | |
|---|---|---|
| JP | 2007-506281 | 3/2007 |
| JP | 2008-221674 | 9/2008 |
| JP | 2009-200505 | 9/2009 |

OTHER PUBLICATIONS

Notification of Reason(s) for Refusal issued by the Japanese Patent Office on Jun. 24, 2013, for Japanese Patent Application No. 2010-121446, and English-language translation thereof.

(Continued)

*Primary Examiner* — Timothy Kennedy
(74) *Attorney, Agent, or Firm* — Finnegan, Henderson, Farabow, Garrett & Dunner LLP

(57) ABSTRACT

According to one embodiment, an imprint mask includes a quartz plate. The quartz plate has a plurality of concave sections formed in part of an upper surface on the quartz plate, and impurities are contained in a portion between the concave sections in the quartz plate.

11 Claims, 15 Drawing Sheets

(56) References Cited

U.S. PATENT DOCUMENTS

| | | |
|---|---|---|
| 7,935,648 B2 | 5/2011 | Maida et al. |
| 7,968,253 B2 | 6/2011 | Kim et al. |
| 2003/0022072 A1 | 1/2003 | Campi et al. |
| 2004/0265709 A1 | 12/2004 | Kanamitsu et al. |
| 2005/0064344 A1 | 3/2005 | Bailey et al. |
| 2007/0049028 A1 | 3/2007 | Subramanian et al. |
| 2007/0134566 A1 | 6/2007 | Maida et al. |
| 2007/0292773 A1 | 12/2007 | Kim et al. |
| 2008/0202163 A1 | 8/2008 | Okinaka et al. |
| 2008/0206655 A1 | 8/2008 | Nozawa et al. |
| 2009/0140458 A1 | 6/2009 | Xu et al. |
| 2010/0104852 A1 | 4/2010 | Fletcher et al. |
| 2010/0144132 A1 | 6/2010 | Subramanian et al. |
| 2011/0034012 A1 | 2/2011 | Kobayashi |

OTHER PUBLICATIONS

JPO English machine translation of JP 2009-200505, retrieved Oct. 21, 2013.

US 9,412,592 B2

IMPRINT MASK, METHOD FOR MANUFACTURING THE SAME, AND METHOD FOR MANUFACTURING SEMICONDUCTOR DEVICE

CROSS-REFERENCE TO RELATED APPLICATIONS

This is a division of application Ser. No. 13/115,758, filed on May 25, 2011, which is incorporated herein by reference.

This application is based upon and claims the benefit of priority from the prior Japanese Patent Application No. 2010-121446, filed on May 27, 2010; the entire contents of which are incorporated herein by reference.

FIELD

Embodiments described herein relate generally to an imprint mask, a method for manufacturing the same, and a method for manufacturing a semiconductor device.

BACKGROUND

Photolithography has hitherto been used for manufacturing semiconductor devices. However, with miniaturization of the semiconductor devices, photolithography is becoming insufficient in resolving power, and pattern formation is thus becoming difficult. Hence, nanoimprinting has recently come to be used in place of photolithography.

In nanoimprinting, concavities and convexities are formed by selectively removing the surface of a quartz substrate, a pattern (device pattern) obtained by inverting a resist pattern desired to be formed, and an alignment mark for alignment are formed, and thus an imprint mask is produced. Then, an ultraviolet cure resist material is applied on the substrate to be processed, and the imprint mask is pressed onto this resist material. Next, while the imprint mask is held pressed, the resist material is irradiated with ultraviolet rays through the imprint mask, to be cured. In this manner, the device pattern formed in the imprint mask is transferred to the resist material, to form the resist pattern. In nanoimprinting, since there are fewer factors of variations in focus depth, aberration, exposure, and the like which have been problems with conventional photolithography, once one imprint mask is produced, a large number of resist patterns can be formed in an extremely simple and accurate manner.

Incidentally, manufacturing of the semiconductor device includes a process of forming a new pattern on a substrate previously formed with a pattern. In the case of using nanoimprinting for such a process, it is necessary to perform alignment of the imprint mask with respect to the substrate with high accuracy. This alignment is performed by overlapping an alignment mark formed in the imprint mask on an alignment mark formed on the substrate, while observing the marks with visible light.

However, since a refractive index of quartz as the material for the imprint mask with respect to the visible light is almost equivalent to a refractive index of the ultraviolet cure resist material with respect to the visible light, when the imprint mask is pressed onto the resist material and the resist material gets into the concave section of the alignment mark, the alignment mark becomes invisible. There has thus been a problem in that the alignment cannot be performed with sufficient accuracy.

DETAILED DESCRIPTION

In general, according to one embodiment, an imprint mask includes a quartz plate. The quartz plate has a plurality of concave sections formed in part of an upper surface on the quartz plate, and impurities are contained in a portion between the concave sections in the quartz plate.

In general, according to another embodiment, an imprint mask includes a quartz plate. The quartz plate has a device region and an alignment mark region set in the quartz plate, and a refractive index of light in the alignment mark region is different from a refractive index in the device region.

In general, according to still another embodiment, a method is disclosed for manufacturing an imprint mask. The method can include forming a pattern made of a metal on a quartz plate. The method can include etching the quartz plate using the pattern as a mask. In addition, the method can include introducing impurities into at least a part of an etched region in the quartz plate. An introduction depth of the impurities is made smaller than a depth of the etching.

In general, according to still another embodiment, a method is disclosed for manufacturing an imprint mask. The method can include forming a pattern made of a metal on a quartz plate. The method can include introducing impurities into at least a part of the quartz plate using the pattern as a mask. In addition, the method can include etching at least a region in which the impurities have been introduced in the quartz plate, using the pattern as a mask. The depth of the etching is made larger than an introduction depth of the impurities.

In general, according to still another embodiment, a method is disclosed for manufacturing a semiconductor device. The method can include arranging a resist material on a substrate. The method can include pressing an imprint mask, in which a device pattern and an alignment mark are formed on an under surface of the imprint mask, onto a resist material, while performing alignment with respect to the substrate by use of the alignment mark. The method can include curing the resist material, while pressing the imprint mask, to form a resist pattern made of the resist material. The method can include separating the imprint mask from the resist pattern. In addition, the method can include performing processing on the substrate using the resist pattern as a mask. The imprint mask includes a quartz plate, the alignment mark is formed with a plurality of concave sections, and impurities are contained in a portion between the concave sections.

Various embodiments will be described hereinafter with reference to the accompanying drawings.

First, a first embodiment is described.

Figure 1:
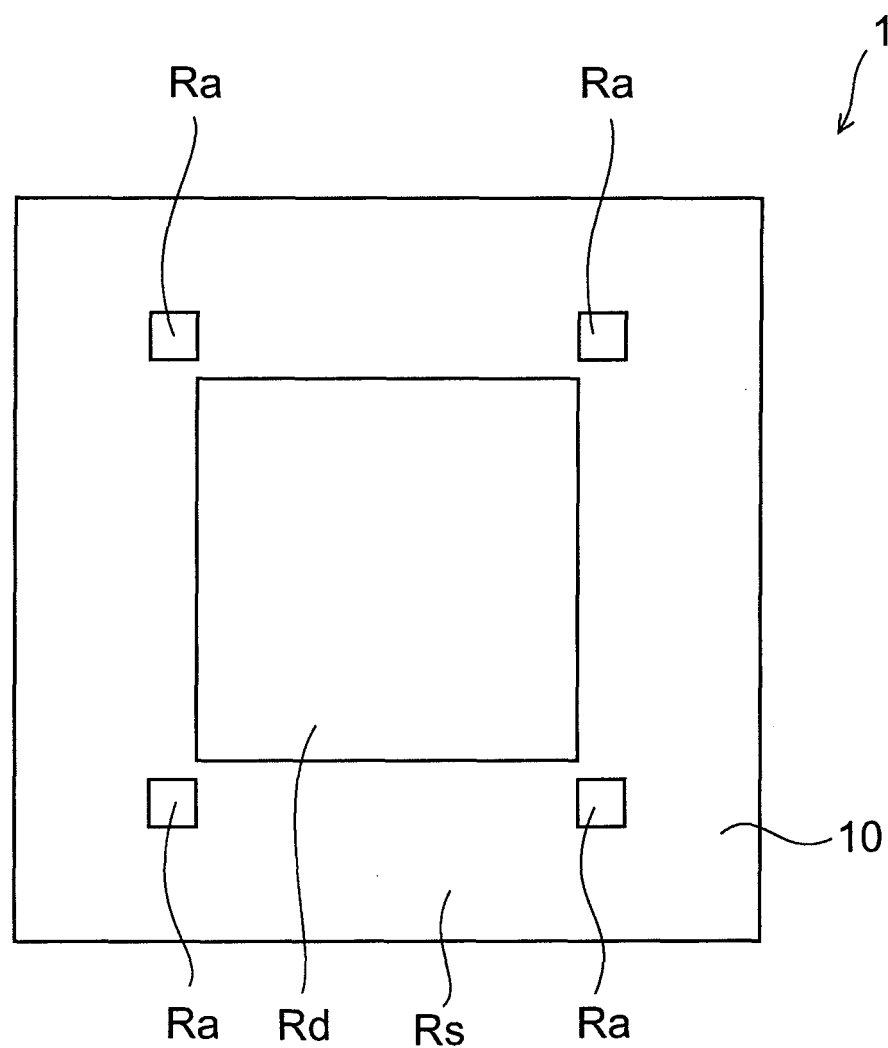
FIG. 1 is a plan view illustrating an imprint mask according to a first embodiment.
Figure 2:
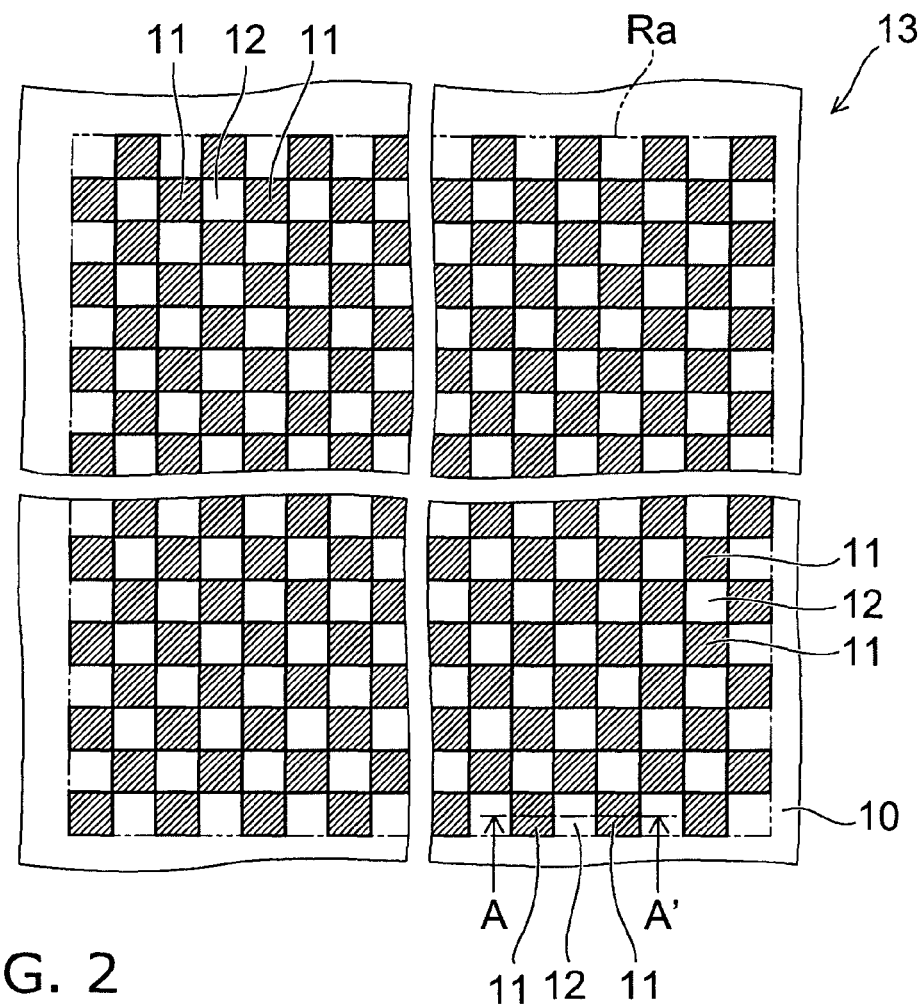
FIG. 2 is a plan view illustrating an alignment mark region shown in FIG. 1.
Figure 3:
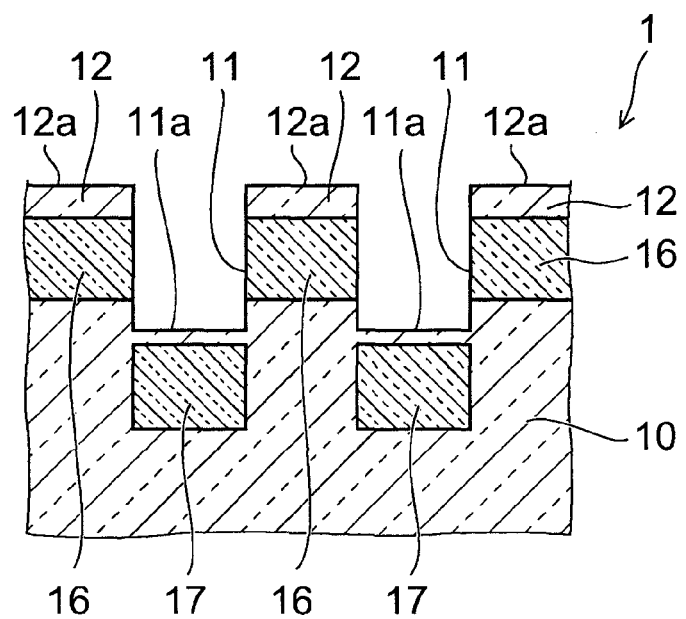
FIG. 3 is a cross-sectional view along a line A-A' shown in FIG. 2.

FIG. 1 is a plan view illustrating an imprint mask according to the embodiment, FIG. 2 is a plan view illustrating an alignment mark region shown in FIG. 1, and FIG. 3 is a cross sectional view along a line A-A' shown in FIG. 2.

It is to be noted that in FIG. 2, concave sections are shown by being hatched for the sake of simplicity of the drawing. Further, these drawings are schematic, and a ratio of dimensions of each section is not necessarily consistent with that of an actual product. This also applies to later-mentioned other drawings.

As shown in FIG. 1, an imprint mask 1 according to the embodiment includes a quartz plate 10. The quartz plate 10 is made of a single crystal of silicon dioxide ($SiO_2$), and has a plate-like shape, which is for example a square plate-like shape. It is to be noted that a refractive index of quartz with respect to visible light is about 1.4. A rectangular device region Rd is set in a central portion of the imprint mask 1, and a frame-like peripheral region Rs is provided on the periphery of the device region Rd. Further, in the peripheral region Rs, alignment mark regions Ra are set at one or more locations, which are for example four locations. The shape of the alignment mark region Ra is, for example, square. One example is that the quartz plate 10 has a thickness of several mm and a one-side length of 152 mm, the device region Rd has a one-side length of 26 mm and the other-side length of 33 mm, and the alignment mark region Ra has a one-side length of 0.5 mm (500 μm).

As shown in FIGS. 2 and 3, in the alignment mark region Ra, a plurality of concave sections 11 is formed in the upper surface of the quartz plate 10, and a portion between the concave sections 11 in the quartz plate 10 is a convex section 12. Seen from above, namely seen in a direction vertical to the upper surface of the quartz plate 10, the concave section 11 and the convex section 12 have square shapes, for example, and are arranged in a checked pattern. That is, the concave sections 11 and the convex sections 12 are alternately arranged along mutually orthogonal two directions. Further, the concave section 11 and the convex section 12 each have a one-side length of 2 μm, for example. Moreover, a depth of the concave section 11, namely a height of the convex section 12 or namely a distance between an upper surface 12a of the convex section 12 and a bottom surface 11a of the concave section 11, is 50 nm, for example. The concave sections 11 and the convex sections 12 constitute an alignment mark 13.

Further, gallium (Ga) is contained as impurities in the convex section 12, namely the portion between the concave sections 11. This gallium is introduced by being ion-implanted from above. Thereby, a gallium diffusion layer 16 is formed inside the convex section 12. The gallium diffusion layer 16 is a layer which is formed of quartz as a base material and contains gallium. In a thickness direction of the quartz plate 10, a concentration of gallium in the convex section 12 and a region immediately thereunder is normally distributed, and a peak of its concentration profile is located inside the convex section 12. For example, this peak is located at the same height as the center of the side surface of the convex section 12 in the thickness direction. For example, when the convex section 12 has a height of 50 nm, a peak of the concentration profile of gallium is located 25 nm under the upper surface 12a of the convex section 12.

Further, gallium is also contained in a portion corresponding to the region immediately under the concave section 11 in the quartz plate 10, to form the gallium diffusion layer 17. As is the gallium diffusion layer 16, the gallium diffusion layer 17 is also a layer which is formed of quartz as a base material and contains gallium. A concentration distribution of gallium in the gallium diffusion layer 17 is similar to that in the gallium diffusion layer 16. That is, the concentration of gallium in the gallium diffusion layer 17 is normally distributed with respect to the thickness direction, and when the convex section 12 has a height of 50 nm, a peak of a concentration profile of gallium in the gallium diffusion layer 17 is located 25 nm under the bottom surface 11a of the concave section 11. The gallium diffusion layers 16 and 17 are part of the quartz plate 10, and integrally formed with portions other than the gallium diffusion layers 16 and 17 in the quartz plate 10.

Meanwhile, in the device region Rd of the imprint mask 1, a device pattern 15 (cf. FIG. 6) is formed in the upper surface of the quartz plate 10. Although the device pattern is also made up of concave sections formed in the upper surface of the quartz plate 10, the concave sections constituting the device pattern are finer than the concave sections 11 constituting the alignment mark, and each have a width of the order of 15 to 20 nm. It is to be noted that a depth of the concave section in the device pattern is equivalent to the depth of the concave section 11 in the alignment mark, and is 50 nm, for example.

When the quartz plate contains the impurities, the refractive index of light differs as compared with the case that the impurities are not contained. When the quartz plate contains gallium, the refractive index to the visible light becomes larger. For this reason, a refractive index of light in the alignment mark region Ra is higher than that in the device region Rd in the imprint mask 1. Further, when the quartz plate contains gallium, transmittances of the visible light and ultraviolet ray become low as compared with the case that gallium is not contained. Therefore, in the imprint mask 1, the transmittance of light in the alignment mark region Ra is lower than that in the device region Rd with respect to the thickness direction of the quartz plate 10.

Next, a method for manufacturing an imprint mask according to the embodiment is described.

FIGS. 4A to 4D and FIGS. 5A to 5C are process sectional views illustrating the method for manufacturing the imprint mask according to the embodiment.

It is to be noted that FIGS. 4A to 4D and FIGS. 5A to 5C show only part of an alignment mark region. This also applies to later-mentioned FIGS. 11A to 11D, 14A to 14D, 16A to 16E, and 17A to 17C.

Figure 4A:
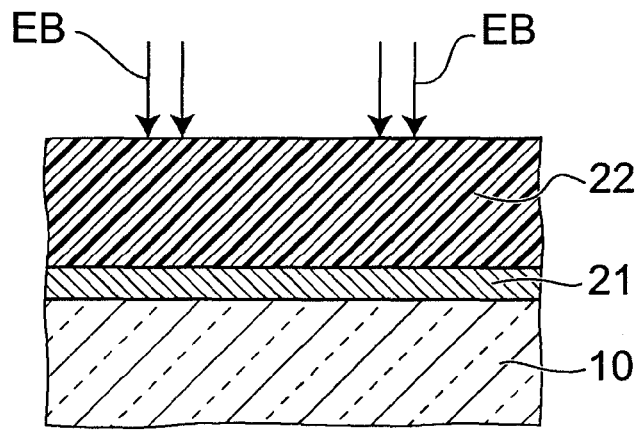
FIGS. 4A to 5C are process cross-sectional views illustrating a method for manufacturing the imprint mask according to the embodiment.

First, as shown in FIG. 4A, the quartz plate 10 is prepared. A chromium film 21 with a film thickness of about several nm is then formed on the upper surface of the quartz plate 10 by sputtering, for example. Next, an electron-beam resist film 22 is formed on the chromium film 21 by application method, for example. Subsequently, electric-beam drawing is performed by selectively irradiating the electron-beam resist film 22 with electron beams EB, so as to draw a device pattern and an alignment mark.

Figure 4B:
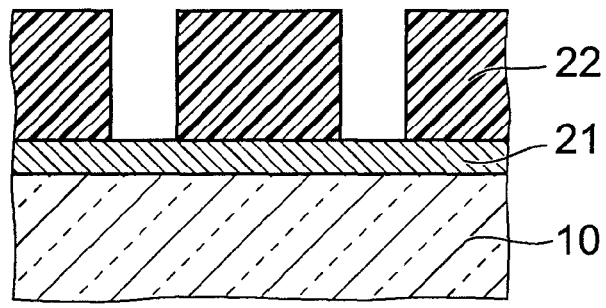

Next, as shown in FIG. 4B, the electron-beam resist film 22 is developed. Thereby, the portion irradiated with the electron beams in the electron-beam resist film 22 is removed, and the electron-beam resist film 22 is patterned.

Figure 4C:
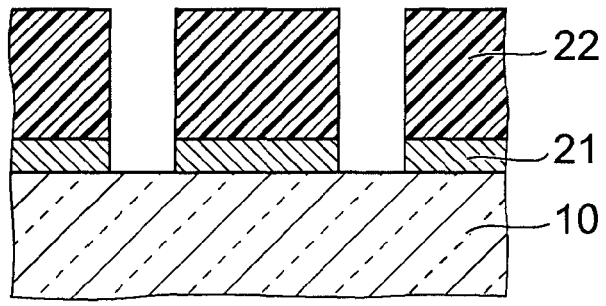

Next, as shown in FIG. 4C, dry etching is performed with the patterned electron-beam resist film 22 used as a mask and chlorine ($Cl_2$) gas and oxygen ($O_2$) gas, for example, used as etching gas, to selectively remove the chromium film 21. Thereby, the chromium film 21 is patterned so as to have the same pattern as the electron-beam resist film 22.

Figure 4D:
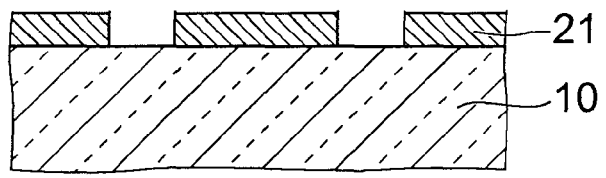

Next, as shown in FIG. 4D, the electron-beam resist film 22 is removed.

Figure 5A:
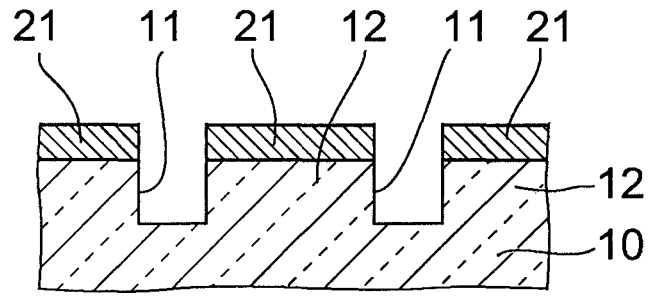

Next, as shown in FIG. 5A, dry etching is performed with the patterned chromium film 21 used as a mask and fluorine-based gas such as methane tetrafluoride ($CF_4$) gas used as etching gas, to etch the quartz plate 10. Thereby, the quartz plate 10 is selectively removed, to form a concave section with a depth of, for example, 50 nm in the upper surface of the quartz plate 10. This results in formation of the device pattern and the alignment mark in the upper surface of the quartz plate 10. It is to be noted that at this time, in the alignment mark region Ra, the portion between the concave sections 11 in the quartz plate 10 is the convex section 12. Thereafter, the device pattern and the alignment mark are inspected and corrected.

Figure 5B:
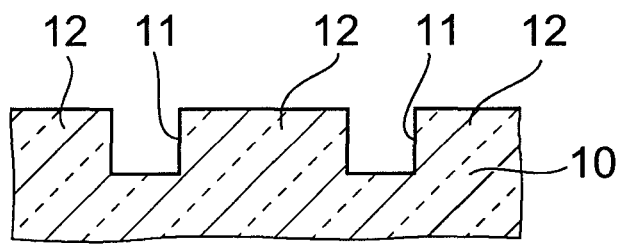

Next, as shown in FIG. 5B, the chromium film 21 is removed.

Figure 5C:
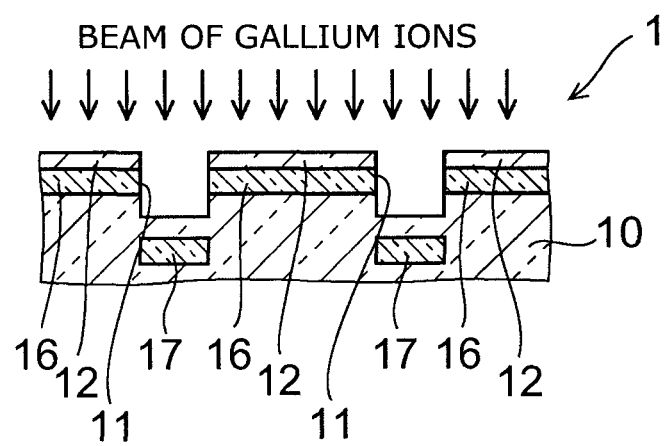

Next, as shown in FIG. 5C, gallium ions are implanted from above into the alignment mark region Ra (cf. FIG. 1) of the quartz plate 10. At this time, an implantation depth of gallium is made smaller than a depth of the etching into the quartz plate 10 shown in FIG. 5A. Thereby, gallium is introduced into the convex section 12 to form the gallium diffusion layer 16, while gallium is also introduced into the region immediately under the concave section 11, to form the gallium diffusion layer 17. An acceleration voltage at the time of implanting the gallium ions is, for example, 30 kV, and a dose amount is, for example, $2\times10^{15}$ ions/cm$^2$. This ion implantation can be performed, for example, by use of a focused ion beam device, manufactured by SII NanoTechnology Inc., but this is not restrictive, and any device may be used as long as being capable of performing ion irradiation, which is for example an ion microscope or a sample cutting processor. Further, at this time, the gallium ions are not implanted into the device region Rd. Thereby, the imprint mask 1 according to the embodiment is manufactured.

Next described is a method for using the imprint mask 1 according to the embodiment, namely a method for manufacturing a semiconductor device according to the embodiment.

FIGS. 6A to 6C and FIGS. 7A to 7C are process sectional views illustrating the method for manufacturing the semiconductor device according to the embodiment.

It is to be noted that FIGS. 6A to 6C and FIGS. 7A to 7C show the alignment mark region Ra only at one location for the sake of simplicity of the drawing.

Figure 6A:
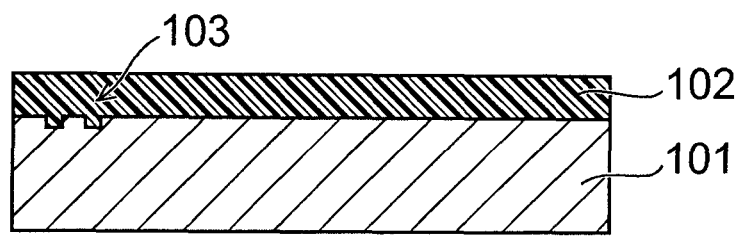
FIGS. 6A to 7C are process cross-sectional views illustrating a method for manufacturing a semiconductor device according to the embodiment.

First, as shown in FIG. 6A, a substrate 101 to be processed is prepared. The substrate 101 may, for example, be a silicon wafer, or may also be one obtained by forming an insulating film, a semiconductor film or a conductive film on the silicon wafer. Further, the substrate 101 may have already been subjected to some processing. An alignment mark 103 is formed in part of the upper surface of the substrate 101. The alignment mark 103 on the substrate 101 has a similar pattern to that of the alignment mark 13 of the imprint mask 1, which is for example a pattern formed by arranging the concave sections and the convex sections in a checked pattern, but an arrangement cycle of the concave sections is a little different from that in the alignment mark 13. Next, a resist material 102 is applied over the entire surface of the substrate 101. The resist material 102 is an ultraviolet cure resist material, and has a refractive index of, for example, 1.4 with respect to the visible light. Further, at this stage, the resist material 102 is in a liquid or semi-liquid state.

Figure 6B:
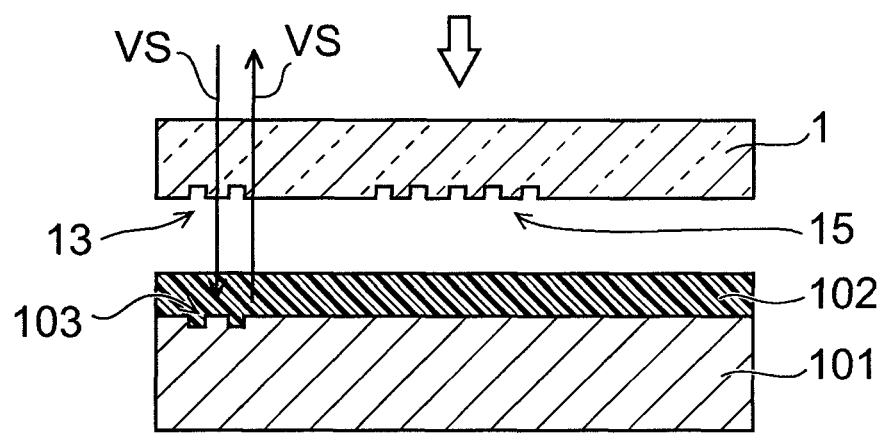

Next, as shown in FIG. 6B, above the substrate 101, the imprint mask 1 is arranged such that the device pattern 15 and the alignment mark 13 turn downward. The imprint mask 1 is then moved toward the substrate 101. At this time, visible light VS is applied from above the imprint mask 1, and the alignment mark 13 of the imprint mask 1 and the alignment mark 103 of the substrate 101 are overlapped and detected, to position the imprint mask 1 with respect to the substrate 101, based upon a result of the detection. Specifically, by means of an optical detection device such as a CCD (Charge Coupled Device) camera, a moiré, which occurs due to a difference between an arrangement cycle of the concave sections 11 in the alignment mark 13 and an arrangement cycle of the concave sections in the alignment mark 103, is detected, to position the imprint mask 1 with a margin within several nm. It should be noted that, since an interface between the quartz plate and the air can be optically clearly detected at the time before the alignment mark 13 coming into contact with the resist material 102, the alignment mark 13 can be detected with accuracy. Meanwhile, since the alignment mark 103 is one formed on the substrate 101, which is for example the silicon wafer, the mark can be clearly detected.

Figure 6C:
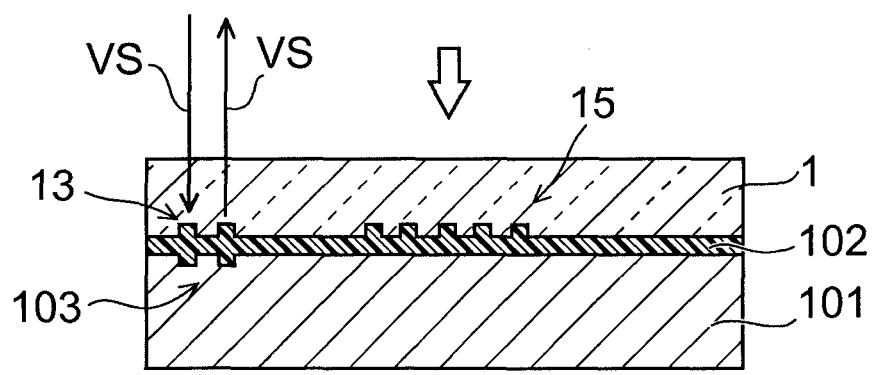

Then, as shown in FIG. 6C, when the imprint mask 1 is brought closer to the substrate 101, the imprint mask 1 eventually comes into contact with the resist material 102. Thereafter, the visible light VS is continuously applied from above the imprint mask 1 and the alignment mark 13 and the alignment mark 103 are overlapped and detected, so that the imprint mask 1 is positioned with respect to the substrate 101 while the imprint mask 1 is pressed onto the resist material 102. Thereby, the resist material 102 is filled in between the substrate 101 and the imprint mask 1. The imprint mask 1 is then rested with respect to the substrate 101.

At this time, assuming that the gallium diffusion layers 16 and 17 (cf. FIG. 3) are not formed in the imprint mask 1, since a refractive index of the quartz as the material for the imprint mask 1 is almost equivalent to a refractive index of the resist material 102, after the alignment mark 13 coming into contact with the resist material 102, an interface between the quartz plate 10 and the resist material 102 becomes difficult to be optically detected, and the alignment mark 13 becomes difficult to be detected. This makes the alignment difficult.

However, in the embodiment, the gallium diffusion layer 16 is formed inside the convex section 12 and the gallium diffusion layer 17 is formed in the region immediately under the concave section 11 in the alignment mark region Ra. The refractive indexes of the gallium diffusion layers 16 and 17 with respect to the visible light are higher than the refractive index of the quartz, and at least the gallium diffusion layer 16 is exposed to the side surfaces of the convex section 12. Hence, at least an interface between the side surface of the convex section 12 and the resist material 102 becomes an interface of two kinds of materials with significantly different refractive indexes, thereby to facilitate the detection. Therefore, the alignment mark 13 can be detected with ease. Consequently, in the embodiment, alignment can be performed with accuracy even after the alignment mark 13 coming into contact with the resist material 102.

Figure 7A:
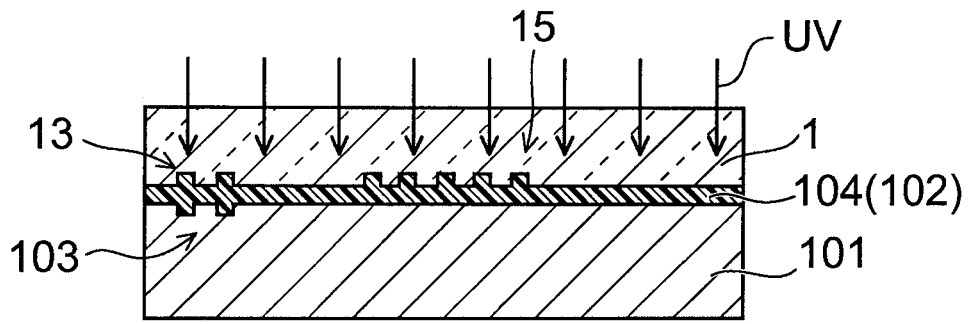

Next, as shown in FIG. 7A, ultraviolet rays UV are applied from above toward the resist material 102 through the imprint mask 1, with the imprint mask 1 being in a pressed state onto the resist material 102. Thereby, the resist material 102 is cured and solidified. This results in transfer of the device pattern 15 of the imprint mask 1 to the resist material 102, to form a resist pattern 104 made of the resist material 102.

Figure 7B:
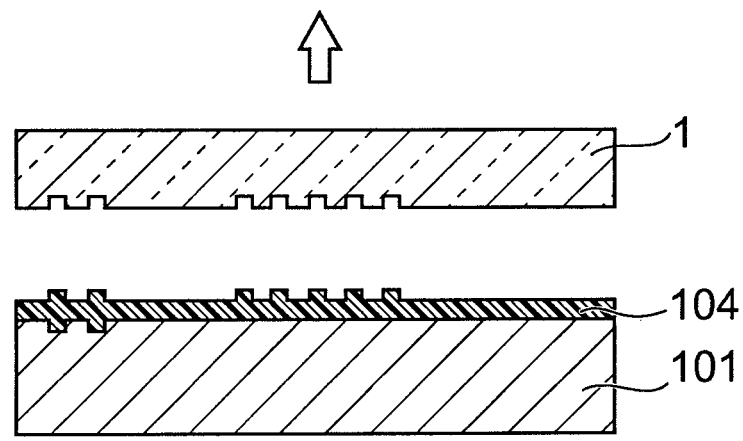

Next, as shown in FIG. 7B, the imprint mask 1 is moved upward, to be separated from the resist pattern 104.

Figure 7C:
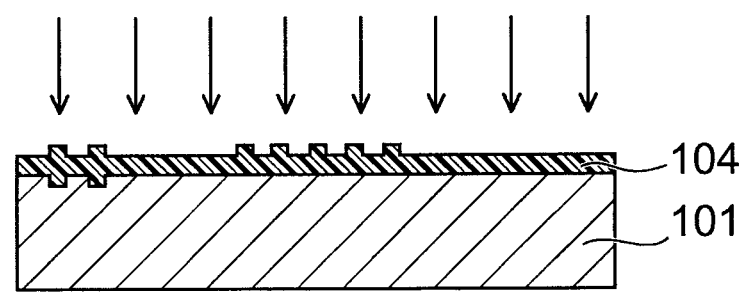

Next, as shown in FIG. 7C, processing is performed on the substrate 101 with the resist pattern 104 used as a mask. This processing may, for example, be etching or implantation of the impurities. For example, in the case of the substrate 101 being a silicon wafer, performing dry etching with the resist pattern 104 used as the mask can selectively remove an upper layer portion of the substrate 101 to form a groove. Alternatively, selectively implanting the impurities with the resist pattern 104 used as the mask can form an impurity diffusion layer in the upper layer portion of the substrate 101. Alternatively, in the case of the substrate 101 being one obtained by forming an insulating film and a conductive film on a silicon wafer, performing dry etching with the resist pattern 104 used as the mask can form a groove or a hole in the insulating film, or process the conductive film into wiring. In this manner, the semiconductor device is manufactured.

Next, effects of the embodiment are described.

In the imprint mask 1 according to the embodiment, gallium is contained in the convex section 12 of the alignment mark region Ra. Further, gallium is also contained in the portion corresponding to the region immediately under the concave section 11 in the quartz plate 10. Accordingly, in the alignment mark region Ra, the refractive index of the quartz plate 10 with respect to the visible light is higher than in the case of gallium being not contained, and the difference in refractive index from the resist material 102 is large. As a result, as shown in FIG. 6C, the alignment mark 13 can be optically detected with ease even after the alignment mark 13 has come into contact with the resist material 102, to facilitate alignment of the imprint mask 1. This can result in accurate positioning of the imprint mask 1 with respect to the substrate 101.

In contrast, when the imprint mask not containing gallium is used in the alignment mark region, since the refractive index of the quartz is almost equivalent to that of the resist material, the alignment becomes difficult after the alignment mark coming into contact with the resist material. For this reason, in the process of pressing the imprint mask onto the resist material, it is necessary to complete the alignment before the imprint mask coming into contact with the resist material and then press the imprint mask onto the resist material so as to prevent displacement as much as possible. However, vertical movement of the imprint mask in the pressing process inevitably causes occurrence of the displacement. It is thus difficult to obtain sufficient alignment accuracy at the time when pressing of the imprint mask is completed, causing deterioration in manufacturing yield of the semiconductor device. In one example, an alignment accuracy of 8 to 10 nm is obtained in the case of using the imprint mask not containing gallium, whereas according to the embodiment, an alignment accuracy of 6 nm can be realized. It should be noted that in the case of forming a pattern with a half pitch of 22 nm, allowable alignment accuracy is about 7 mm.

Further, in the embodiment, the concentration profile of gallium has a peak inside the convex section 12 in the thickness direction of the quartz plate 10. Hence, it is possible to efficiently arrange gallium, having been introduced into the quartz plate 10, inside the convex section 12, so as to obtain a large effect with a small amount of gallium.

Moreover, in the embodiment, the chromium film 21 is removed from the top of the quartz plate 10, and the imprint mask 1 is made up only of the quartz plate 1. Therefore, the imprint mask 1 remains unchanged in terms of the configuration thereof even when repeatedly cleaned, and thus has excellent resistance characteristics to cleaning. In contrast, when an imprint mask is configured by coating the quartz plate with another material such as a chromium film, the coated material comes to disappear every time the imprint mask is cleaned, whereby it is difficult to hold the characteristics of the imprint mask immediately after manufacturing.

In the method for manufacturing the imprint mask according to the embodiment, in the process shown in FIG. 5C, gallium is ion-implanted to be introduced into the alignment mark region Ra of the quartz plate 10. At this time, the implantation depth of gallium is made smaller than the depth of the etching shown in FIG. 5A. This can make a large portion of gallium, having been implanted into the upper surface 12a, remain inside the convex section 12, so as to efficiently form the gallium diffusion layer 16 inside the convex section 12. Further, with the gallium diffusion layer 16 being exposed on the side surfaces of the convex section 12, the side surfaces of the convex section 12 can be clearly detected when the alignment mark 13 comes into contact with the resist material 102, so as to improve the alignment accuracy.

Further, in the embodiment, gallium is implanted only into the alignment mark region Ra, and not implanted into the device region Rd. This allows efficient use of a small amount of gallium, to obtain the foregoing effect. It is consequently possible to suppress the cost and time required for ion-implantation of gallium. Moreover, it is possible to avoid deterioration in transmittance of the ultraviolet ray in the device region Rd.

According to the method for manufacturing the semiconductor device in the embodiment, as described above, it is possible to enhance the alignment accuracy of the imprint mask 1, so as to improve a yield of the semiconductor device. This can result in reduction in manufacturing cost of the semiconductor device. The method for manufacturing the semiconductor device according to the embodiment is applicable, for example, to a critical layer of the semiconductor device, namely processing of a layer having the finest processing dimension. As one example thereof, the method is applicable to formation of an active area of an NAND flash memory.

Next, a test example of the embodiment is described.

In the test example, conditions for implanting the gallium ions were decided by the following procedure.

Figure 8:
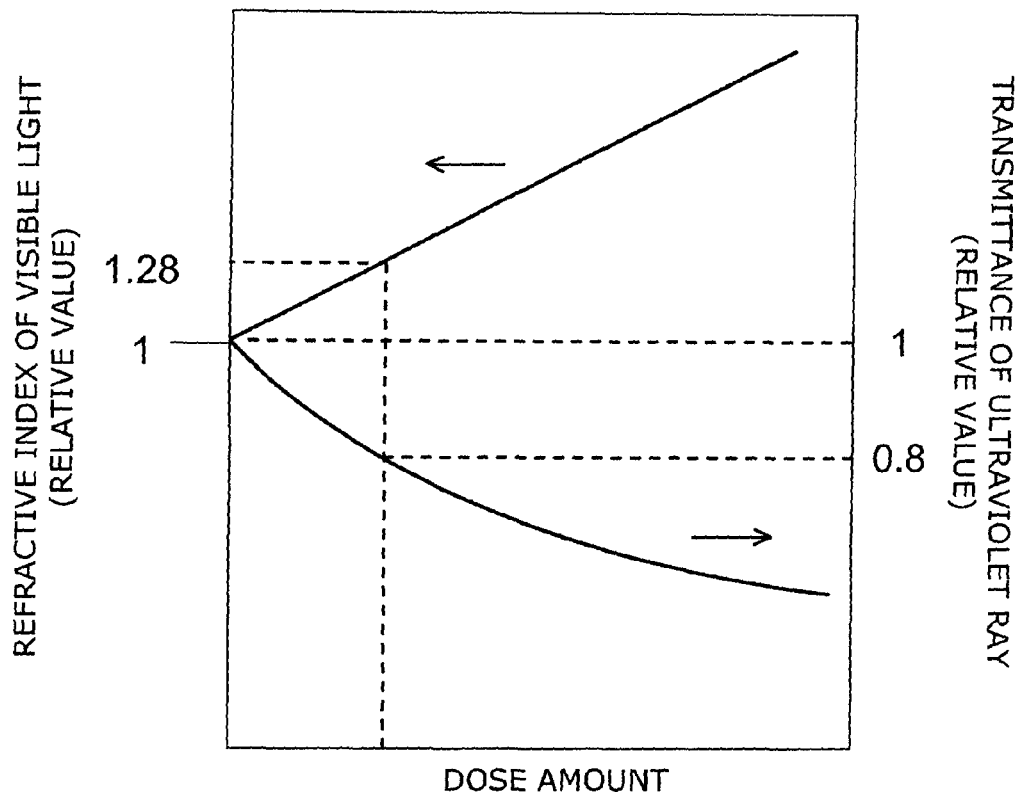
FIG. 8 is a graph with a dose amount of the gallium ions taken on the horizontal axis and a refractive index of the visible light and a transmittance of the ultraviolet ray taken on the vertical axes, illustrating the relation between an introduction amount of gallium and optical characteristics of the quartz plate.
Figure 9:
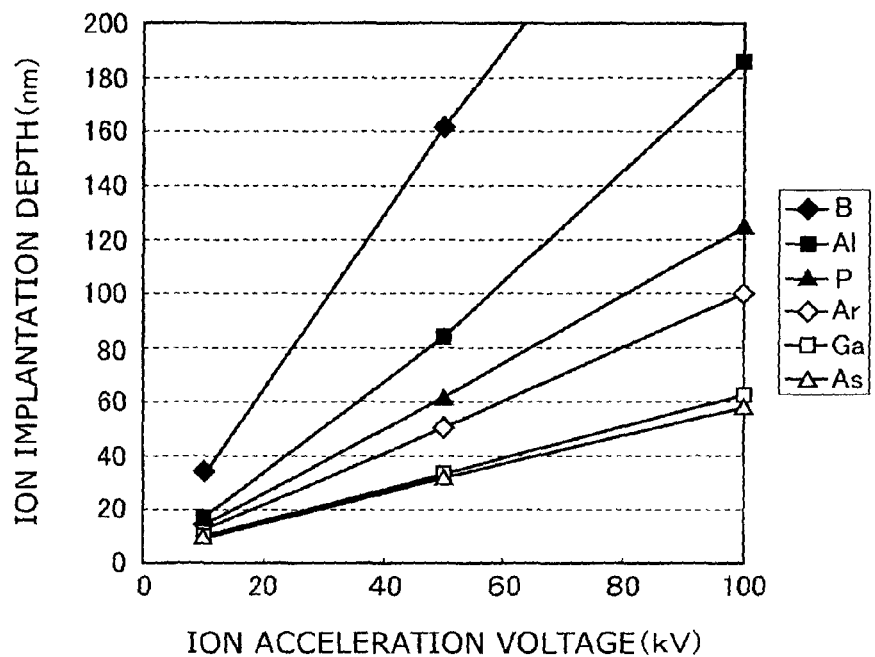
FIG. 9 is a graph with an acceleration voltage of the ions taken on the horizontal axis and an implantation depth of the ions taken on the vertical axis, illustrating the relation between the acceleration voltage of the ions and the implantation depth in the quartz.

FIG. 8 is a graph with a dose amount of the gallium ions taken on the horizontal axis and a refractive index of the visible light and a transmittance of the ultraviolet ray taken on the vertical axes, illustrating the relation between an introduction amount of gallium and optical characteristics of the quartz plate. FIG. 9 is a graph with an acceleration voltage of the ions taken on the horizontal axis and an implantation depth of the ions taken on the vertical axis, illustrating the relation between the acceleration voltage of the ions and the implantation depth in the quartz.

It is to be noted that the refractive index of the visible light and the transmittance of the ultraviolet ray shown on the vertical axes of FIG. 8 are represented by relative values with the case of not introducing gallium regarded as one.

As shown in FIG. 8, when the dose amount of gallium increases, the refractive index of the quartz introduced with gallium with respect to the visible light increases, and the transmittance with respect to the ultraviolet ray decreases. That is, the dose amount of gallium is preferably large for increasing the refractive index of the quartz to increase the difference from the refractive index of the resist material so as to make the alignment mark recognizable, whereas the dose amount of gallium is preferably small for ensuring an amount of irradiation of the ultraviolet rays required for curing the resist material. Hence, the dose amount of gallium is required to be a value in a range satisfying both requirements for the refractive index with respect to the visible light and the transmittance with respect to the ultraviolet ray.

In the test example, the transmittance of the quartz plate 10 with respect to the ultraviolet ray, which is required for curing the resist material on practical conditions, was set to 80% of a quartz plate not introduced with gallium. In this case, the dose amount of the gallium ions is $2 \times 10^{15}$ ions/cm². Further, as shown in FIG. 8, with this dose amount, the refractive index of the quartz with respect to the visible light increases up to 128% of the refractive index of the quartz not introduced with gallium, whereby it is possible to obtain a refractive index sufficient at the time of the alignment. Accordingly, the dose amount of the gallium ions was set to $2 \times 10^{15}$ ions/cm².

Further, as shown in FIG. 9, when the acceleration voltage of ions increases, the implantation depth increases in almost proportion thereto. The implanted impurities are almost normally distributed along the thickness direction of the quartz plate with a position corresponding to this implantation depth regarded as the center. Therefore, in order to efficiently implant the impurities into the convex section 12, the implantation depth is preferably made smaller than the etching depth of the concave section 11. In particular, making the implantation depth of the impurities half the etching depth can locate the peak of the impurity profile at the center of the convex section 12 in the thickness direction, so as to effectively introduce the impurities into the convex section 12.

In the test example, the etching depth, namely the depth of the concave section 11, was set to 50 nm. It is therefore preferable to set the implantation depth of gallium to 25 nm. From FIG. 9, the acceleration voltage is required to be set to about 30 kV for making the implantation depth of gallium 25 nm. The acceleration voltage of gallium was thus set to 30 kV.

Next, a second embodiment is described.

Figure 10:
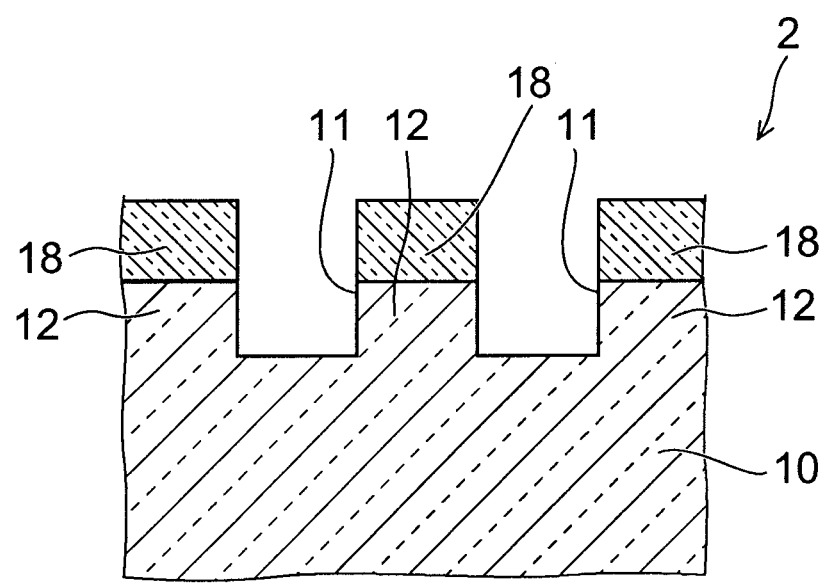
FIG. 10 is a cross-sectional view illustrating an alignment mark region of an imprint mask according to a second embodiment.

FIG. 10 is a sectional view illustrating an alignment mark region of an imprint mask according to the embodiment.

As shown in FIG. 10, an imprint mask 2 according to the embodiment is different as compared with the imprint mask 1 (cf. FIG. 3) according to the foregoing first embodiment in that a gallium diffusion layer is not formed in the portion corresponding to the region immediately under the concave section 11 while a gallium diffusion layer 18 is formed inside the convex section 12 in the quartz plate 10. As with the gallium diffusion layers 16 and 17 (cf. FIG. 3) in the foregoing first embodiment, the gallium diffusion layer 18 is a layer which is formed of quartz as a base material and contains gallium, and is formed integrally with other portions in the quartz plate 10. Configurations other than the above in the imprint mask 2 are similar to those in the imprint mask 1 according to the foregoing first embodiment.

Next, a method for manufacturing an imprint mask according to the embodiment is described.

FIGS. 11A to 11D are process sectional views illustrating the method for manufacturing the imprint mask according to the embodiment.

First, the foregoing processes shown in FIGS. 4A to 4D are implemented, to form the chromium film 21 patterned on the quartz plate 10.

Figure 11A:
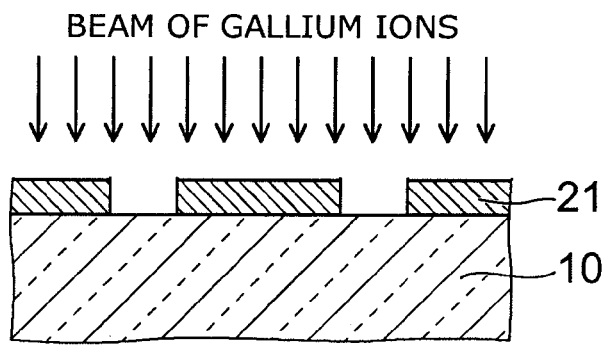
FIGS. 11A to 11D are process cross-sectional views illustrating a method for manufacturing the imprint mask according to the second embodiment.

Next, as shown in FIG. 11A, the gallium ions are implanted from above into the alignment mark region Ra (cf. FIG. 1) of the quartz plate 10. At this time, an acceleration voltage of the gallium ions is set to such a value with which at least part of the gallium ions reach the quartz plate 10 through the chromium film 21. Thereby, in the region where the chromium film 21 remains, the gallium ions are implanted into the quartz plate 10 through the chromium film 21. On the other hand, in the region where the chromium film 21 has been removed, the gallium ions are directly implanted into the quartz plate 10.

Figure 11B:
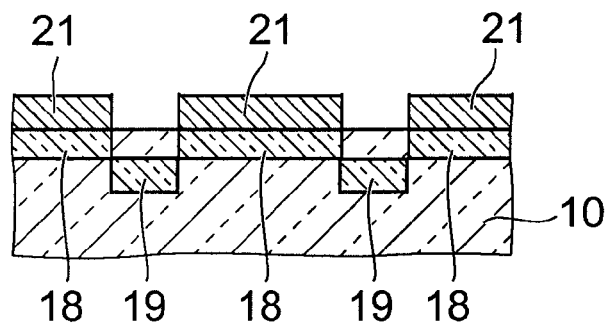

Consequently, as shown in FIG. 11B, in the uppermost layer of the quartz plate 10 in the region where the chromium film 21 remains, the gallium diffusion layer 18 is formed. On the other hand, in the region where the chromium film 21 has been removed, a gallium diffusion layer 19 is formed at a position deeper than the gallium diffusion layer 18. This is because the gallium ions having passed through the chromium film has lost energy and can reach only a thin portion of the quartz plate 10.

Figure 11C:
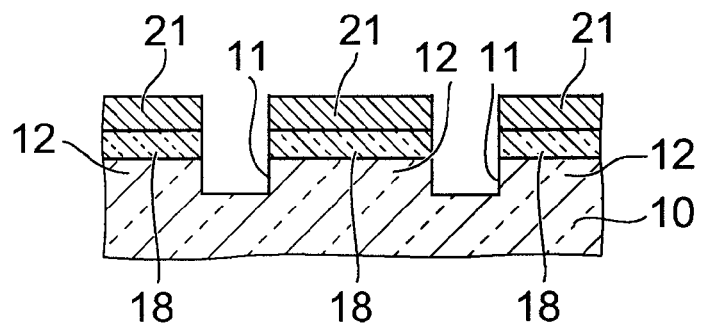

Next, as shown in FIG. 11C, dry etching is performed with the chromium film 21 used as the mask, to etch the quartz plate 10. Thereby, the quartz plate is selectively removed in the region where the chromium film 21 has been removed, to form a concave section in the upper surface of the quartz plate 10. This results in formation of the device pattern 15 and the alignment mark 13. At this time, the depth of the dry etching is made larger than the introduction depth of the gallium ions in the process shown in FIG. 11A, namely the formation depth of the gallium diffusion layer 19. The gallium diffusion layer 19 is thereby removed by the dry etching along with the quartz. On the other hand, the gallium diffusion layer 18 is not removed since being formed in the region immediately under the chromium film 21. This results in formation of the gallium diffusion layer 18 inside the convex section 12 and no formation of the gallium diffusion layer in the region immediately under the concave section 11. Thereafter, the device pattern and the alignment are inspected and corrected.

It is to be noted that, since gallium introduced into the quartz plate 10 is continuously distributed in the thickness direction of the quartz plate 10, gallium introduced into the region immediately under the concave section 11 may not be completely removed even when the depth of the dry etching is made larger than the introduction depth of the gallium ions. Also in this case, a content of gallium in the portion corresponding to the region immediately under the concave section 11 in the quartz plate 10 is smaller than a content of gallium in the convex section 12 and the portion corresponding to the region immediately thereunder in the quartz plate 10.

Figure 11D:
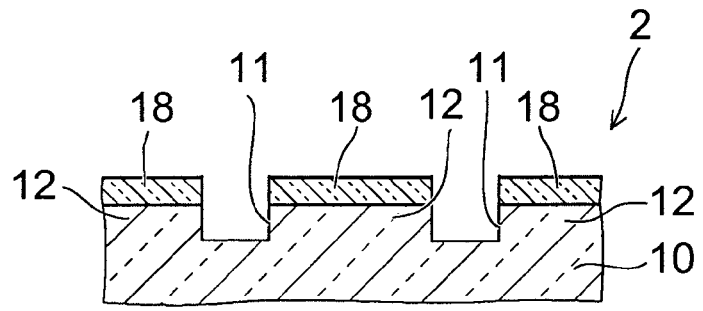

Next, as shown in FIG. 11D, the chromium film 21 is removed. In such a manner, the imprint mask 2 according to the embodiment is manufactured. A manufacturing method other than the above in the embodiment is similar to that in the foregoing first embodiment. Further, a method for manufacturing a semiconductor device according to the embodiment is similar to that in the foregoing first embodiment except for the use of the imprint mask 2.

Next, effects of the embodiment are described.

In the imprint mask 2 according to the embodiment, in the alignment mark region Ra, gallium is contained in the convex section 12, but gallium is not contained in the region immediately under the concave section 11. As described above, the transmittance of light changes when impurities are introduced into the quartz, and for example when gallium is introduced, the transmittance of the visible light decreases. For this reason, the transmittance of the visible light in the thickness direction of the quartz plate 10 is lower in the region corresponding to the convex section 12 than the region corresponding to the concave section 11. Thereby, when the alignment mark 13 is observed by means of the visible light reflected by the substrate 101 in the processes shown in FIGS. 6B and 6C, a contrast is formed between the concave section 11 and the convex section 12. This can result in further facilitating detection of the alignment mark 13.

That is, in the foregoing first embodiment, the refractive index of the quartz plate 10 in the alignment mark region Ra was made different from the refractive index of the resist material 102, to facilitate detection of the interface between the quartz plate 10 and the resist material 102, and the position of the imprint mask 1 with respect to the quartz plate 101 was then detected through use of phase modulation between the alignment mark 13 and the alignment mark 103. In contrast, in the embodiment, on top of this effect of the first embodiment, the transmittance of light is made different between the concave section 11 and the convex section 12 to make the alignment mark 13 usable as an intensity modulation lattice, so as to further improve the accuracy of the alignment mark. The effects in the embodiment other than the above are similar to those in the foregoing first embodiment.

Next, a test example of the embodiment is described.

In the test example, conditions for implanting the gallium ions were decided by the following procedure.

Figure 12A:
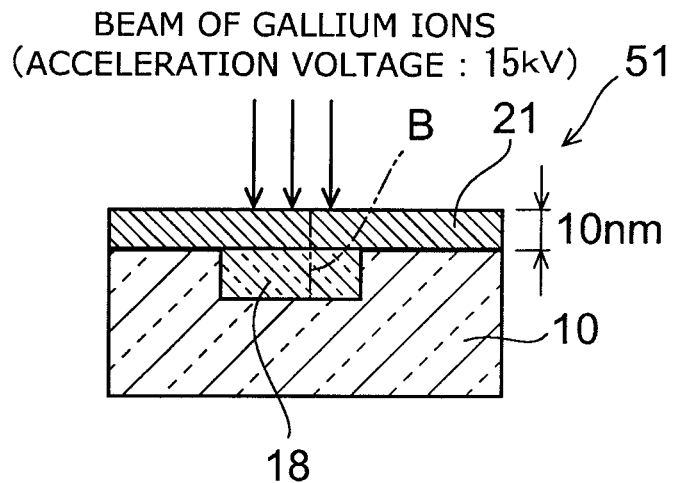
FIG. 12A is a cross-sectional view illustrating a sample of the test example.
Figure 12B:
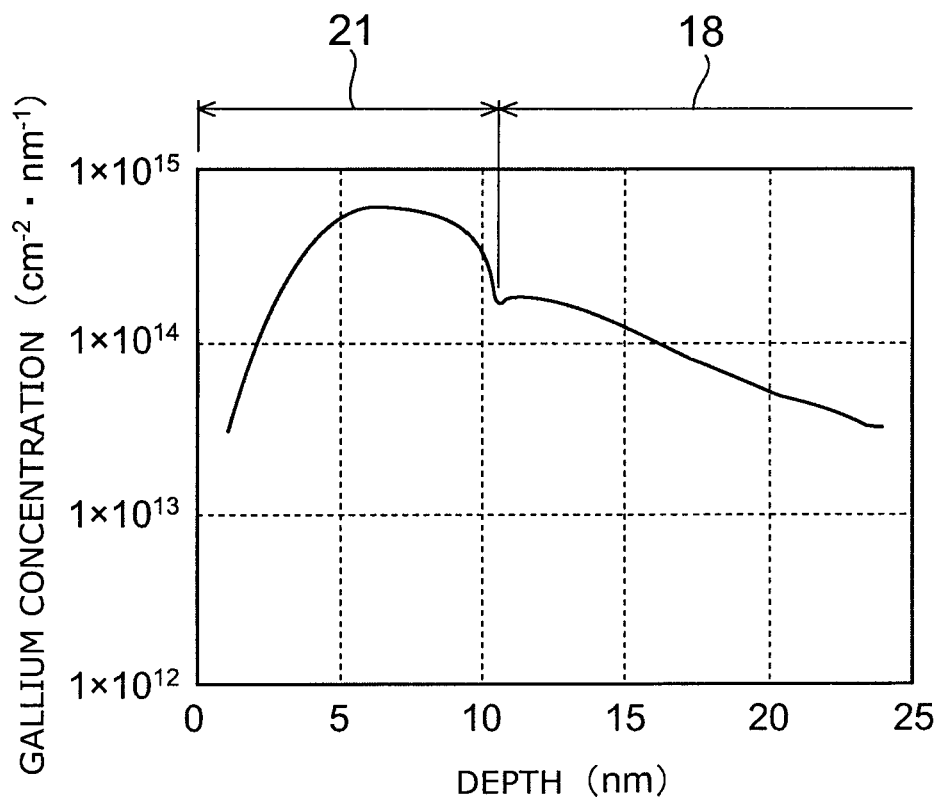
FIG. 12B is a graph with a depth of the chromium film from the upper surface taken on the horizontal axis and a gallium concentration taken on the vertical axis, illustrating a gallium concentration profile along a straight line B shown in FIG. 12A

FIG. 12A is a sectional view illustrating a sample of the test example, and FIG. 12B is a graph with a depth of the chromium film from the upper surface taken on the horizontal axis and a gallium concentration taken on the vertical axis, illustrating a gallium concentration profile along a straight line B shown in FIG. 12A.

As shown in FIG. 11B, in the region where the chromium film 21 has been removed, namely the region where the quartz plate 10 is exposed, it is necessary that the implantation depth of the gallium ions does not exceed a predetermined etching depth of the quartz plate 10 in the process shown in FIG. 11C. This is because, when the implantation depth of the gallium ions exceeds the predetermined etching depth, a large portion of the gallium diffusion layer cannot be removed by the etching. Hence an upper limit of the acceleration voltage of the gallium ions is decided based upon the etching depth. Meanwhile, in the region where the chromium film 21 remains, it is necessary that at least part of the gallium ions pass through the chromium film 21 to reach the quartz plate 10. Hence a lower limit of the acceleration voltage of the gallium ions is decided based upon a film thickness of the chromium film 21.

In the test example, the etching depth, namely the depth of the concave section 11, was set to 50 nm. In this case, the upper limit of the acceleration voltage of the gallium ions is about 40 kV. Meanwhile, the lower limit of the acceleration voltage can be estimated as follows. As shown in FIG. 12A, a case was assumed where the gallium ions were implanted into a sample 51, with the film thickness of the chromium film 21 set to 10 nm, at the acceleration voltage set to 15 kV and in the dose amount set to $6 \times 10^{15}$ ions/cm$^2$, and a gallium concentration inside the sample 51 was calculated by simulation. The result is shown in FIG. 12B. The vertical axis of FIG. 12B indicates the number of atoms of gallium existing in each layer when the sample 51 is divided into a plurality of layers each having a thickness of 1 nm.

As shown in FIG. 12B, a peak of the gallium concentration profile is located at a depth of about 6 nm, and this position corresponds to the inside of the chromium film 21. That is, in this sample, a large portion of gallium atoms remains inside the chromium film 21, and it cannot be said that the gallium atoms were efficiently implanted into the quartz plate 10. In this case, when the film thickness of the chromium film 21 is set to smaller than 6 nm, which is for example not larger than 5 nm, the peak of the gallium concentration profile is located inside the quartz plate 10, and gallium is therefore efficiently implanted into the quartz plate 10. On the contrary, when the film thickness of the chromium film 21 is set to 5 nm, the lower limit of the acceleration voltage is about 15 kV. According to the above results, the imprint mask according to the second embodiment can be manufactured when the etching depth is set to not smaller than 50 nm, the film thickness of the chromium film 21 set to not larger than 5 nm, and the acceleration voltage of the gallium ions set to 15 to 40 kV, Further, the dose amount of gallium ions can be decided by the following procedure.

In the gallium-ion implanting process shown in FIG. 11A, when the dose amount of gallium ions is excessively small, the refractive index and the transmittance of the convex section 12 cannot be changed to the degrees required for the alignment. Hence the lower limit of the dose amount of gallium ions is decided based upon the refractive index and the transmittance that the convex section 12 is required to have. On the other hand, when the dose amount of gallium ions is excessively large, the chromium film 21 is sputtered, to become thinner, and becomes unable to be used as the mask in the etching process shown in FIG. 11C. Hence the upper limit of the dose amount of gallium ions is decided based upon an initial film thickness of the chromium film 21 and the acceleration voltage of the gallium ions. As thus described, it is necessary to decide an optimal value of the dose amount of gallium ions in consideration of the balance between the optical characteristics of the convex section 12 which are required at the time of the alignment and the resistance characteristics which are required at the time of the dry etching.

In the test example, when the acceleration voltage of the gallium ions was set to 30 kV and the dose amount was set to $1 \times 10^{16}$ ions/cm$^2$, the film thickness of the chromium film 21 decreased by about 2 nm with this ion implantation. Therefore, in the case of implanting the gallium ions on these conditions, the initial film thickness of the chromium film 21 may be made not smaller than a film thickness obtained by adding 2 nm to the film thickness required as the mask for etching.

Next, a third embodiment is described.

Figure 13:
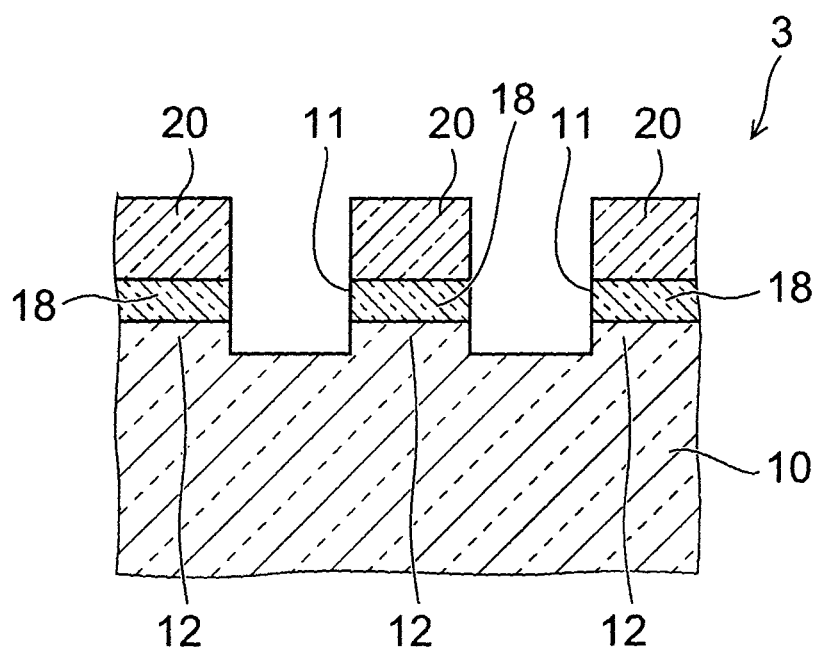
FIG. 13 is a cross-sectional view illustrating an alignment mark region of an imprint mask according to the embodiment.

FIG. 13 is a sectional view illustrating an alignment mark region of an imprint mask according to the embodiment.

As shown in FIG. 13, an imprint mask 3 according to the embodiment is different as compared with the imprint mask 2 (cf. FIG. 10) according to the foregoing second embodiment in that a mixing layer 20 is formed in the upper most layer of the convex section 12 in the quartz plate 10. In the mixing layer 20, chromium, silicon, oxygen and gallium are contained. Inside the mixing layer 20, a composition is inclined in the thickness direction, and in a portion excluding a gallium concentration in the composition of the mixing layer 20, a chromium concentration becomes higher in an ascending direction, while a silicon concentration and an oxygen concentration become higher in a descending direction. The gallium diffusion layer 18 is provided under the mixing layer 20 in the convex section 12, and the mixing layer 20 is in contact with the gallium diffusion layer 18. Configurations other than the above in the imprint mask 3 are similar to those in the imprint mask 2 according to the foregoing second embodiment.

Next, a method for manufacturing the imprint mask according to the embodiment is described.

FIGS. 14A to 14D are process sectional views illustrating the method for manufacturing the imprint mask according to the embodiment.

First, the foregoing processes shown in FIGS. 4A to 4D are implemented, to form the chromium film 21 patterned on the quartz plate 10. However, the film thickness of the chromium film 21 is made smaller than that in the foregoing second embodiment, which is for example not larger than 5 nm.

Figure 14A:
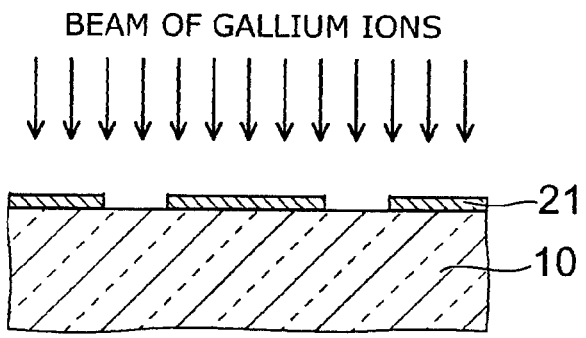
FIGS. 14A to 14D are process cross-sectional views illustrating a method for manufacturing an imprint mask according to a third embodiment.

Next, as shown in FIG. 14A, the gallium ions are implanted from above into the alignment mark region Ra (cf. FIG. 1) of the quartz plate 10. At this time, the acceleration voltage of the gallium ions is made higher than in the foregoing second embodiment, which is for example 40 kV. This leads to occurrence of a mixing phenomenon between the chromium film 21 and the quartz plate 10. This mixing phenomenon is a phenomenon which occurs because implantation of the gallium ions causes chromium atoms constituting the chromium film 21 to be pressed into the quartz plate 10 on an interface between the chromium film 21 and the quartz plate 10, and silicon atoms and oxygen atoms constituting the quartz plate 10 to bounce inside the chromium film 21.

Figure 14B:
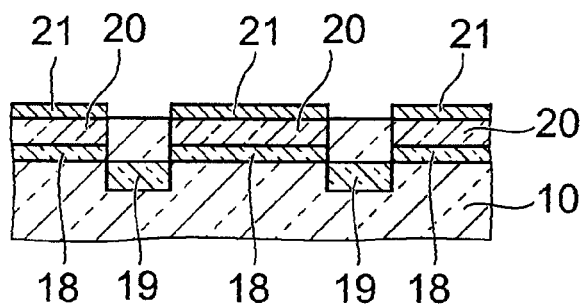

Thereby, as shown in FIG. 14B, the mixing layer 20 is formed in the uppermost layer of the quartz plate 10 in the region where the chromium film 21 remains, and the gallium diffusion layer 18 is formed in a region immediately thereunder. That is, in the region where the chromium film 21 remains, the chromium film 21, the mixing layer 20 and the gallium diffusion layer 18 are arrayed in this order downward from above. In the embodiment, the mixing layer 20 is defined as a layer at least containing chromium, silicon and oxygen. On the contrary, silicon and oxygen are defined not to be substantially contained in the chromium film 21, and chromium should not be substantially contained in the gallium diffusion layer 18. Further, gallium may be contained in the chromium film 21 and the mixing layer 20.

Meanwhile, in the region where the chromium film 21 has been removed, the gallium diffusion layer 19 is formed at a deeper position than the gallium diffusion layer 18. Further, the mixing film is not formed in this region since the chromium film 21 does not remain therein.

Figure 14C:
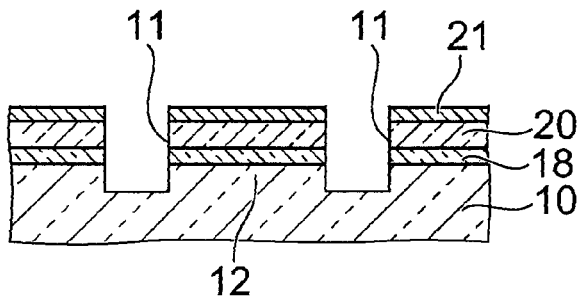

Next, as shown in FIG. 14C, dry etching is performed with the chromium film 21 used as a mask and fluorine-based gas such as methane tetrafluoride ($CF_4$) gas used as etching gas, to etch the quartz plate 10. Thereby, the quartz plate is selectively removed, to form a concave section in the upper surface of the quartz plate 10. At this time, the depth of the dry etching is made larger than the introduction depth of the gallium ions in the process shown in FIG. 14A. Thereby, the gallium diffusion layer 19 is removed by the dry etching along with the quartz.

Figure 14D:
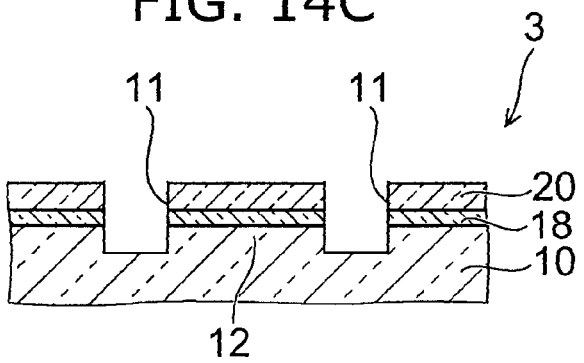

Next, as shown in FIG. 14D, the chromium film 21 is removed. At this time, the upper portion of the mixing layer 20 may be removed along with the chromium film 21, but at least the lower portion of the mixing layer 20, namely the portion where the chromium atoms have been implanted into the quartz plate 10 remains. In such a manner, the imprint mask 3 according to the embodiment is manufactured. A manufacturing method other than the above in the embodiment is similar to that in the foregoing second embodiment. Further, a method for manufacturing a semiconductor device according to the embodiment is similar to that in the foregoing first embodiment except for the use of the imprint mask 3.

In the embodiment, in the alignment mark region Ra of the imprint mask 3, the mixing layer 20 is formed inside the convex section 12, together with the gallium diffusion layer 18. The mixing layer 20 has a low transmittance of the visible light since containing chromium as a metal element. For this reason, a higher contrast can be realized in the alignment mark 13. This further improves the alignment accuracy at the time of imprinting.

In addition, it is considered that the foregoing mixing phenomenon also occurs in the foregoing second embodiment, but in the embodiment, the film thickness of the chromium film 21 is made smaller to increase the acceleration voltage of the gallium ions so that the mixing phenomenon is positively used. With the acceleration voltage of the gallium ions increased, kinetic energy of the gallium ions increases, to make the mixing apt to occur. Further, with the initial film thickness of the chromium film made smaller, a loss of energy is suppressed at the time of passage of the gallium ions through the chromium film, to make the mixing apt to occur.

Further, in the embodiment, it is also considered that part of the chromium film 21 may disappear by sputtering in the gallium-ion implanting process shown in FIG. 14A, due to the initial film thickness of the chromium film 21 being small. However, also in this case, the mixing layer 20 containing chromium is hardly etched when dry etching is performed by means of fluorine-based etching gas. Therefore, in the process of etching the quartz plate 10 which is shown in FIG. 14C, the mixing layer 20 can be used as a mask.

Next, the test example of the embodiment is described.

Figure 15A:
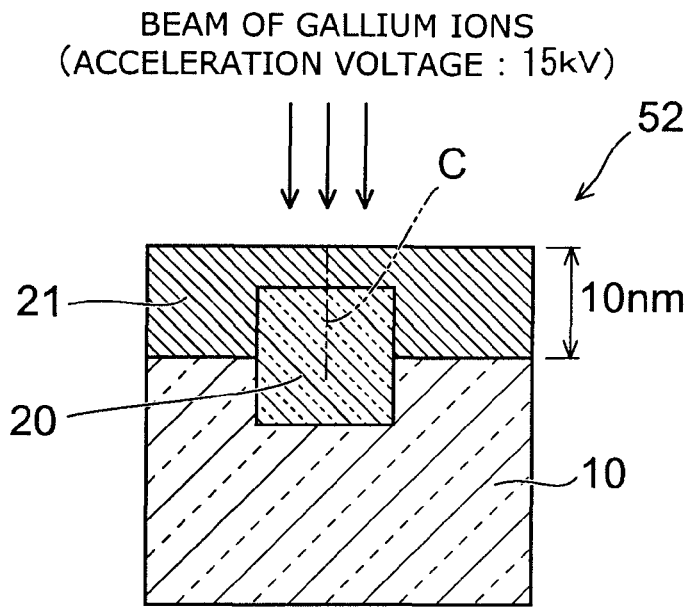
FIG. 15A is a sectional view illustrating a sample of the test example.
Figure 15B:
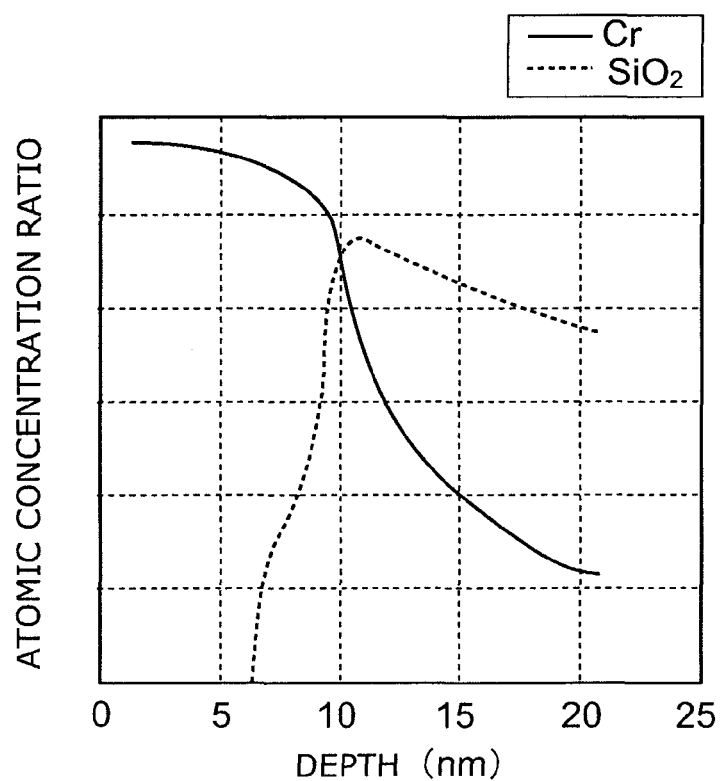
FIG. 15B is a graph with a depth of the chromium film from the upper surface taken on the horizontal axis and an atomic concentration ratio taken on the vertical axis, illustrating a profile of a composition along a straight line C shown in FIG. 15A.

FIG. 15A is a sectional view illustrating a sample of the test example, and FIG. 15B is a graph with a depth of the chromium film from the upper surface taken on the horizontal axis and an atomic concentration ratio taken on the vertical axis, illustrating a profile of a composition along a straight line C shown in FIG. 15A.

It is to be noted that FIG. 15B shows a value obtained by converting concentrations of silicon and oxygen into that of silicon oxide ($SiO_2$).

As shown in FIG. 15A, in the test example, a case was assumed where a sample 52, formed with the chromium film 21 having a film thickness of 10 nm on the quartz plate 10, was irradiated with beams of the gallium ions from above the chromium film 21, to form the mixing layer 20. The acceleration voltage of the gallium ions was set to 15 kV. Then, the number of atoms with respect to each 1-nm depth in a 1-cm square region seen from above was calculated by simulation, to create the profile shown in FIG. 15B.

As shown in FIG. 15B, silicon and oxygen are not substantially contained in the uppermost layer of the sample 52. Further, concentrations of silicon and oxygen monotonously increase as the positions thereof become deeper from a depth of 6 nm to a depth of 10 nm, and monotonously decrease as the positions thereof become deeper from the depth of 10 nm to a depth of 21 nm. On the other hand, a concentration of chromium monotonously decreases as the position thereof becomes deeper from the uppermost layer to the depth of 21 nm. It is thereby found that the film thickness of the chromium film 21 decreases to about 6 nm due to implantation of the gallium ions. Further, it is found that the mixing layer 20 is formed at a position at least from a depth of about 6 nm to a depth of about 21 nm.

Next, a fourth embodiment will be described.

The configuration of an imprint mask according to the embodiment is similar to the imprint mask 2 (see FIG. 10) according to the foregoing second embodiment.

A method for manufacturing an imprint mask according to the embodiment will be described hereinafter.

FIGS. 16A to 16E are process sectional views illustrating the method for manufacturing the imprint mask according to the embodiment.

Figure 16A:
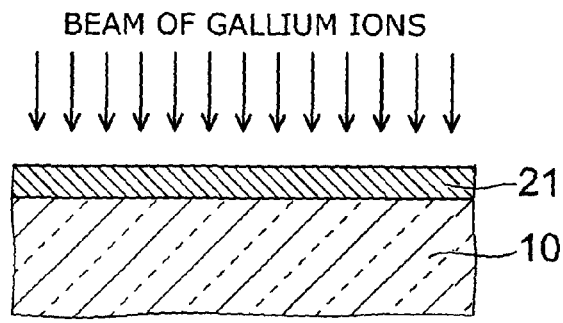
FIGS. 16A to 16E are process cross-sectional views illustrating a method for manufacturing the imprint mask according to a fourth embodiment.

First, as shown in FIG. 16A, the quartz plate 10 is prepared and the chromium film 21 is formed on the quartz plate 10. At this time, a position of a region where the alignment mark 13 is to be formed on the quartz plate 10 is previously determined. The position of the region, for example, can be determined by a distance or the like from a corner of the quartz plate 10.

Figure 16B:
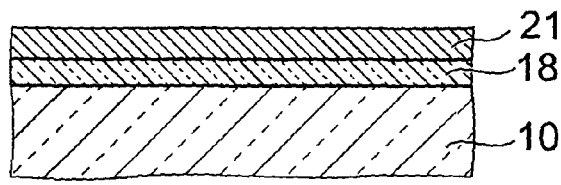

Next, gallium ions are implanted into this region. Thereby, as shown in FIG. 16B, the gallium ions are implanted into the quartz plate 10 through the chromium film 21 to form the gallium diffusion layer 18 in the uppermost layer of the quartz plate 10, namely, the region being in contact with the chromium film 21. The implantation condition of the gallium ions can be determined, for example, by the process similar to the test example (see FIGS. 12A and 12B) of the foregoing second environment. That is, the lower limit of the acceleration voltage of the gallium ions is set to such a value with which the gallium ions penetrate through the chromium film 21 and the upper limit of the acceleration voltage of the gallium ions is set to such a value with which the implantation depth of the gallium ions does not exceed an etching depth. In the embodiment, for example, a film thickness of the chromium film 21 is set to approximate 5 nm and the acceleration voltage is set to 15 to 40 kV. The lower limit of the dose amount of the gallium ions is set to such a value with which the refractive index and the transmittance of the convex section 12 can be varied sufficiently, the upper limit of the dose amount is set to such a value with which the chromium film 21 is made to remain sufficiently as an etching mask.

Figure 16C:
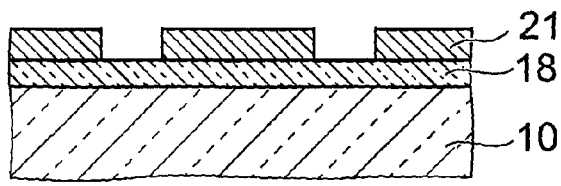

Next, as shown in FIG. 16C, the chromium film 21 is patterned. This patterning is performed, for example, as described in the foregoing first embodiment, by applying an electron-beam resist film on the chromium film 21, performing electron-beam lithography, developing the electron-beam resist film, and dry-etching the chromium film 21 using the patterned electron-beam resist film as a mask, for example, with chlorine-based gas. Alternatively, a resist pattern is directly formed using a replica template replication device for high volume production and the chromium film 21 may be dry-etched using this resist pattern as a mask.

Figure 16D:
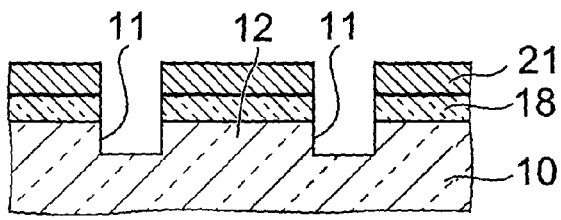

Next, as shown in FIG. 16D, the quartz plate 10 is dry-etched with fluorine-based gas such as tetrafluoromethane or the like as an etching gas using the patterned chromium film 21 as a mask. Thereby, the concave sections 11 are formed on the upper surface of the quartz plate 10 and a portion between the concave sections 11 forms the convex section 12. At this time, the etching depth is made larger than the implantation depth of the gallium ions. Thus, the gallium diffusion layer 18 is etched and removed in a region not covered with the chromium film 21 in the quartz plate 10.

Figure 16E:
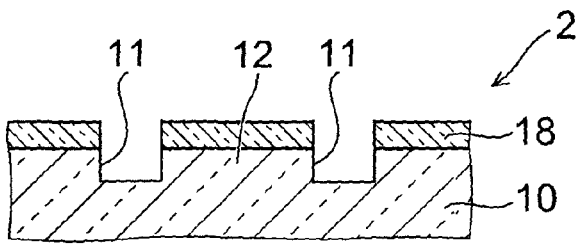

Next, as shown in FIG. 16E, for example, the chromium film 21 is peeled by wet-etching using cerium nitrate. Thus, the alignment mark with contrast to white light can be formed similar to the foregoing second embodiment.

In the embodiment, different from the foregoing second and third embodiments, the ion implantation process is not performed during the patterning process. Thereby, possibility of dust attachment to the quartz plate 10 or the like is decreased and process defects can be reduced. The method for manufacturing the imprint mask and the method for manufacturing the semiconductor device of the embodiment other than the above are similar to those of the second embodiment.

Next, a fifth embodiment will be described.

The configuration of an imprint mask according to the embodiment is similar to that of the imprint mask 2 (see FIG. 10) according to the forgoing second embodiment.

A method for manufacturing an imprint mask according to the embodiment will be described.

Figure 17A:
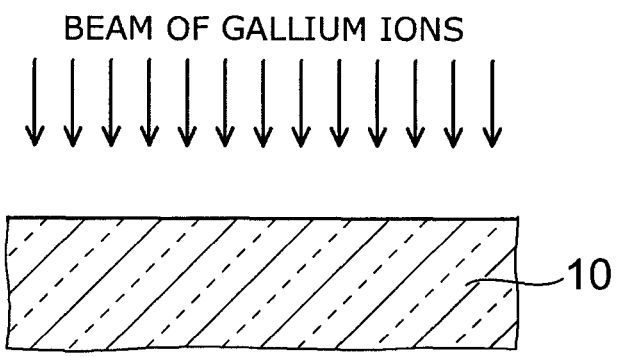
FIGS. 17A to 17C are process cross-sectional views illustrating a method for manufacturing the imprint mask according to a fifth embodiment.
Figure 17B:
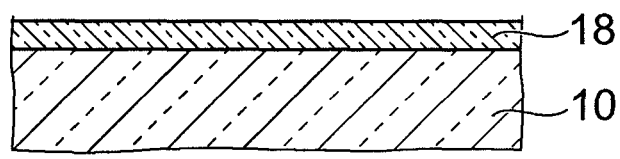
Figure 17C:
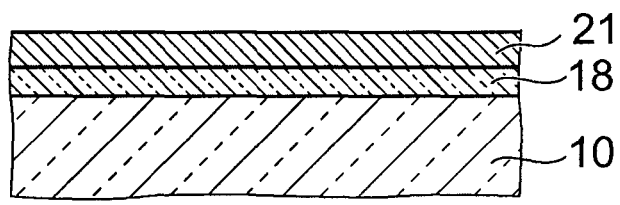

FIGS. 17A to 17C are process sectional views illustrating the method for manufacturing the imprint mask according to the embodiment.

First, as shown in FIG. 17A, the quartz plate 10 is prepared. Subsequently, the gallium ions are implanted in the quartz plate 10 without formation of the chromium film 21. At this time, the ion implantation is performed at least to the region where the alignment mark is to be formed. And the acceleration voltage of the ion implantation is made lower than the case of ion implantation through the chromium film 21 as in the foregoing each embodiment. The implantation depth of the gallium ions is made to surpass the etching depth performed in a later process. For example, the implantation depth of the gallium ions is set shallower than 50 nm. Thereby, as shown in FIG. 17B, the gallium diffusion layer 18 is formed in the uppermost portion of the quartz plate 10.

Next, as shown in FIG. 17C, chromium is deposited, for example, by a sputtering method and the chromium film 21 is formed on the quartz plate 10.

Subsequent processes are similar to the foregoing fourth embodiment. That is, as shown in FIG. 16C, the chromium film is patterned. Next, as shown in FIG. 16D, using the patterned chromium film 21 as a mask, the quartz plate 10 is etched deeper than the implantation depth of the gallium ions. Thereafter, as shown in FIG. 16E, the chromium film 21 is removed. Thereby, the imprint mask similar to the foregoing second embodiment can be manufactured.

According to the embodiment, after implanting the gallium ions in the process shown in FIG. 17A, the chromium film 21 is formed in the process shown in FIG. 17C. Thus, it is unnecessary to consider film reduction of the chromium film 21 due to a sputtering effect by the gallium ions. Therefore, the upper limit of the dose amount of the gallium ions is relaxed and the gallium ions can be implanted with required amount to obtain contrast sufficiently.

Further, according to the embodiment, as similar to the foregoing second embodiment, defects due to dusts can be reduced because the ion implantation process is not performed during the patterning process. The method for manufacturing the imprint mask and the method for manufacturing the semiconductor device in the embodiment other than the above are similar to the foregoing second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For example, although the example was shown in the foregoing first embodiment where the implantation depth of the ions was made half the etching depth, the implantation depth is not restricted to this, and can be any depth as long as gallium is introduced into the convex section.

Further, although the example was shown in each of the foregoing embodiments where the impurities to be implanted into the quartz plate are gallium, this is not restrictive. The impurities to be implanted into the quartz plate can be any one as long as making a change in the composition of the quartz and may, for example, be one element selected from a group consisting of gallium, xenon, antimony, argon, silicon, nitrogen, and lead. In this case, the acceleration voltage at the time of the ion implantation can be selected as appropriate in accordance with the type of the ions.

Moreover, although the example was shown in each of the foregoing embodiments where the chromium film is formed as the mask to be used at the time of etching the quartz plate, this is not restrictive. This mask can be any film as long as being able to take an etching selection ratio with the quartz plate, and is favorably a metal film, for example. As the metal film, for example, there can be used a film made up of one or more metals selected from a group consisting of chromium, tantalum, and ruthenium. Alternatively, there may be used a film made up of a compound of these metals, or a film compositely contained with these metals or the compound. In this case, these metals are contained in the mixing layer in the foregoing third embodiment.

Furthermore, although the gallium ions are implanted into the whole of the alignment mark region in each of the foregoing embodiments, the gallium ions may be selectively implanted only into a boundary portion between the concave section 11 and the convex section 12. In this case, in the imprint mask after manufacturing, a gallium concentration in the portion including the side surfaces of the convex section 12 becomes higher than a gallium concentration in a central portion of the convex section 12 seen from above. It is thereby possible to improve characteristics of the alignment mark as an object to be detected with a smaller implantation amount of gallium.

According to the embodiments described above, it is possible to realize an imprint mask capable of performing alignment with accuracy, a method for manufacturing the same, and a method for manufacturing a semiconductor device.

What is claimed is:

1. A substrate for an imprint mask, comprising a quartz plate, the quartz plate having a plurality of concave sections formed in a portion of an upper surface on the quartz plate, a first concave section of the plurality of concave sections having a first side region, a second side region facing the first side region, and a bottom region, impurities being contained in the first side region and the second side region;

a concentration of impurities in the first side region and a concentration of impurities in the second side region being larger than a concentration of impurities in the bottom region, and each of a concentration profile of the impurities in the first side region and a concentration profile of the impurities in the second side region having a peak in a thickness direction of the substrate.

2. The substrate according to claim 1, wherein the impurities in the first side region and the second side region are introduced by ion-implantation.

3. The substrate according to claim 1, wherein the impurities are one element selected from the group consisting of gallium, xenon, antimony, argon, nitrogen, and lead.

4. The substrate according to claim 1, wherein the first side region, the second side region, and the bottom region are in the surface of quartz plate.

5. The substrate according to claim 1, wherein the bottom region is between the first side region and the second side region.

6. A substrate for an imprint mask, comprising a quartz plate, the quartz plate having a plurality of concave sections formed in a portion of an upper surface on the quartz plate, impurities being contained in a first convex portion of the quartz plate between the concave sections, and a concentration profile of the impurities in the first convex portion having a peak in a thickness direction of the quartz plate.

7. The substrate according to claim 6, wherein the impurities are also contained in a second portion corresponding to a region immediately under one of the concave sections in the quartz plate.

8. The substrate according to claim 6, wherein a content of the impurities in a second portion corresponding to a region immediately under one of the concave sections in the quartz plate is smaller than a content of the impurities in the first convex portion.

9. The substrate according to claim 6, wherein the first convex portion contains a metal.

10. The substrate according to claim 9, wherein the metal is one or more metals selected from the group consisting of chromium, tantalum, and ruthenium.

11. The substrate according to claim 6, wherein the impurities are one element selected from the group consisting of gallium, xenon, antimony, argon, silicon, nitrogen, and lead.

* * * * *